(12) United States Patent
Ko et al.

(10) Patent No.: US 8,701,592 B2
(45) Date of Patent: Apr. 22, 2014

(54) MASK FRAME ASSEMBLY, METHOD OF MANUFACTURING THE SAME, AND METHOD OF MANUFACTURING ORGANIC LIGHT-EMITTING DISPLAY DEVICE USING THE MASK FRAME ASSEMBLY

(75) Inventors: Jung-Woo Ko, Yongin (KR); Ikunori Kobayashi, Yongin (KR); Sang-Shin Lee, Yongin (KR); Taek-Kyo Kang, Yongin (KR)

(73) Assignee: Samsung Display Co., Ltd. (KR)

( * ) Notice: Subject to any disclaimer, the term of this patent is extended or adjusted under 35 U.S.C. 154(b) by 140 days.

(21) Appl. No.: 13/242,521

(22) Filed: Sep. 23, 2011

(65) Prior Publication Data

US 2012/0156812 A1    Jun. 21, 2012

(30) Foreign Application Priority Data

Dec. 20, 2010 (KR) .................. 10-2010-0130933

(51) Int. Cl.
*B05C 11/11* (2006.01)

(52) U.S. Cl.
USPC ...... 118/504; 438/22; 257/E33.001; 118/301; 29/446; 428/136

(58) Field of Classification Search
USPC ....... 313/402; 118/504–506; 438/22; 29/446; 428/136; 257/E33.001
See application file for complete search history.

(56) References Cited

U.S. PATENT DOCUMENTS

| | | | | |
|---|---|---|---|---|
| 6,955,726 B2 * | 10/2005 | Kang et al. | .................... | 118/720 |
| 8,151,729 B2 * | 4/2012 | Ko | .................... | 118/504 |
| 8,350,468 B2 * | 1/2013 | Ko et al. | .................... | 313/506 |
| 2003/0203100 A1 * | 10/2003 | Himeshima et al. | ........... | 427/66 |
| 2003/0221614 A1 | 12/2003 | Kang et al. | | |
| 2005/0000933 A1 * | 1/2005 | Shiratori et al. | ................ | 216/12 |
| 2008/0018236 A1 * | 1/2008 | Arai et al. | .................... | 313/504 |
| 2010/0267227 A1 * | 10/2010 | Ko et al. | ....................... | 438/597 |
| 2011/0139069 A1 * | 6/2011 | Ahn et al. | ..................... | 118/504 |
| 2011/0168087 A1 * | 7/2011 | Lee et al. | ..................... | 118/504 |

(Continued)

FOREIGN PATENT DOCUMENTS

| | | |
|---|---|---|
| JP | 2001 237071 | 8/2001 |
| JP | 2005 302457 | 10/2005 |

(Continued)

OTHER PUBLICATIONS

Machine Translation, JP 2007-169716, Sano, Translation Date: Jul. 29, 2013, JPO & Japio, all pages.*

(Continued)

*Primary Examiner* — Fernando L Toledo
*Assistant Examiner* — Victoria K Hall
(74) *Attorney, Agent, or Firm* — Knobbe Martens Olson & Bear LLP (57) ABSTRACT

A mask frame includes a frame and a mask installed on the frame while being stretched in a first direction. The mask includes a deposition area including a plurality of deposition pattern portions, an edge unit formed to have a thickness greater than a thickness of the deposition area and including a first edge and a second edge that extend in the first direction on two sides of the deposition area, and two or more ribs formed to have a thickness greater than the thickness of the deposition area between deposition pattern portions adjacent to each other in a second direction perpendicular to the first direction.

8 Claims, 6 Drawing Sheets

(56) References Cited

U.S. PATENT DOCUMENTS

| | | |
|---|---|---|
| 2011/0229633 A1 * | 9/2011 | Hong et al. ............... 427/162 |
| 2012/0174862 A1 * | 7/2012 | Lee ............................ 118/504 |
| 2012/0234236 A1 * | 9/2012 | Ko et al. ..................... 118/504 |
| 2012/0279444 A1 * | 11/2012 | Hong .......................... 118/504 |

FOREIGN PATENT DOCUMENTS

| | | | | |
|---|---|---|---|---|
| JP | 2007-169716 | * | 7/2007 | ............. C23C 14/02 |
| JP | 2009-41054 | * | 2/2009 | ............. C23C 14/04 |
| KR | 20030093959 | | 11/2003 | |
| KR | 20050083421 | | 8/2005 | |
| KR | 20060123946 | | 12/2006 | |

OTHER PUBLICATIONS

Machine Translation, JP 2009-41054, Hagiwara, Translation Date: Jul. 29, 2013, JPO & Japio, all pages.*

* cited by examiner

MASK FRAME ASSEMBLY, METHOD OF MANUFACTURING THE SAME, AND METHOD OF MANUFACTURING ORGANIC LIGHT-EMITTING DISPLAY DEVICE USING THE MASK FRAME ASSEMBLY

CROSS-REFERENCE TO RELATED APPLICATIONS

This application claims the benefit of Korean Patent Application No. 10-2010-0130933, filed on Dec. 20, 2010, in the Korean Intellectual Property Office, the disclosure of which is incorporated herein in its entirety by reference.

BACKGROUND

1. Field

The present disclosure relates to a mask frame assembly, a method of manufacturing the same, and a method of manufacturing an organic light-emitting display device using the mask frame assembly.

2. Description of the Related Technology

Organic light-emitting display devices have been spotlighted as next-generation display devices because of their light weight, thin profile, wide viewing angle, fast response time, and low power consumption.

An organic light-emitting display device generally includes a first electrode formed in a predetermined pattern on a transparent insulating substrate, an organic film formed on the first electrode, where the film may be formed by using vacuum deposition, and a second electrode formed on a top surface of the organic film.

The first electrode may be patterned by using a method of wet etching, such as photolithography. However, if the organic film is an organic light-emitting layer for creating a predetermined color image, the organic film and the second electrode formed on the organic film may not be patterned by wet etching. This is because when the organic film is formed and then wet etching is used, moisture generated due to the wet etching penetrates the organic film or remains on the organic film, thereby degrading the performance and the lifetime of the organic light-emitting display device.

Deposition has been used in attempts to solve the problem. In order to manufacture an organic light-emitting display device by using deposition, a fine metal mask (FMM) having the same pattern as a pattern of a thin film to be formed on a substrate is aligned, and a raw material of the thin film is deposited, to form the thin film having a desired pattern.

As the FMM gets larger, an error in etching for forming a pattern may be increased, and sagging of a central portion due to the weight may become serious. Accordingly, divided masks which are obtained by dividing a mask in a plurality of stripe shapes and attaching the same to a frame have been used. However, the divided masks may also undergo some sagging. To address the sagging, when the divided masks are attached to the frame, they may be welded to the frame while being stretched tight in a longitudinal direction.

However, if the divided masks are so welded, while a tensile force is applied in the longitudinal direction in which the divided masks is stretched, a contractile force is applied in a width direction, thereby causing wave-shaped wrinkles in the divided masks. Once such wrinkles occur, since some portions of the divided masks fail to closely contact the substrate, precise patterning may not be achieved.

SUMMARY OF CERTAIN INVENTIVE ASPECTS

The present disclosure provides a mask frame assembly that may prevent wrinkles from occurring when a mask is welded to a frame while being stretched, and a method of manufacturing an organic light-emitting display device with high resolution using the mask frame assembly.

According to one aspect, there is provided a mask frame assembly including: a frame; and a mask installed on the frame while being stretched in a first direction, wherein the mask includes: a deposition area including a plurality of deposition pattern portions; an edge unit formed to have a thickness greater than a thickness of the deposition area and including a first edge and a second edge that extend in the first direction on two sides of the deposition area; and two or more ribs each formed to have a thickness greater than the thickness of the deposition area between deposition pattern portions adjacent to each other in a second direction, where the second direction is perpendicular to the first direction.

The mask frame assembly may further include a dummy deposition pattern portion disposed between the ribs.

A pattern of the dummy deposition pattern portion may be the same as a pattern of each of the deposition pattern portions.

The mask frame assembly may further include a cover mask for covering an area corresponding to the dummy deposition pattern portion.

A width of the dummy deposition pattern portion may be less than a width of each of the deposition pattern portions.

A thickness of the edge unit may be the same as a thickness of each of the ribs.

The edge unit and the ribs may be connected to each other.

The mask may include a plurality of divided masks installed on the frame, wherein the first direction is a longitudinal direction of each of the plurality of divided masks and the second direction is a width direction of each of the plurality of divided masks.

According to another aspect, there is provided a method of manufacturing a mask frame assembly, the method including: preparing a frame; preparing a mask including a deposition area including a plurality of deposition pattern portions, an edge unit formed to have a thickness greater than a thickness of each of the deposition area and including a first edge and a second edge that extend in a first direction on two sides of the deposition area, and two or more ribs formed to have a thickness greater than the thickness of each of the deposition area between deposition pattern portions adjacent to each other in a second direction, where the second direction is perpendicular to the first direction; and installing the mask on the frame by stretching both ends of the mask in the first direction.

The mask may be prepared by electroforming.

The method may further include a dummy deposition pattern portion formed between the ribs.

A pattern of the dummy deposition pattern portion may be the same as a pattern of each of the deposition pattern portions.

The method may further include preparing a cover mask for covering an area corresponding to the dummy deposition pattern portion, and installing the cover mask to cover the dummy deposition pattern portion.

The mask and the frame may be welded to each other by laser welding.

The mask may include a plurality of divided masks that are installed on the frame by stretching both ends of the plurality of divided masks in the first direction, wherein the first direction is a longitudinal direction of each of the plurality of divided masks and the second direction is a width direction of each of the plurality of divided masks.

According to another aspect, there is provided a method of manufacturing an organic light-emitting display device including a substrate, a first electrode and a second electrode disposed on the substrate to face each other, and an organic film disposed between the first electrode and the second electrode, wherein the organic film or the second electrode is deposited by using a mask frame assembly including a frame and a mask installed on the frame while being stretched in a first direction, wherein the mask includes: a deposition area including a plurality of deposition pattern portions; an edge unit formed to have a thickness greater than a thickness of the deposition area and including a first edge and a second edge that extend in the first direction on two sides of the deposition area; and two or more ribs formed to have a thickness greater than the thickness of the deposition area between deposition pattern portions adjacent to each other in a second direction, where the second direction is perpendicular to the first direction.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

Certain embodiments will now be described more fully with reference to the accompanying drawings.

Figure 1:
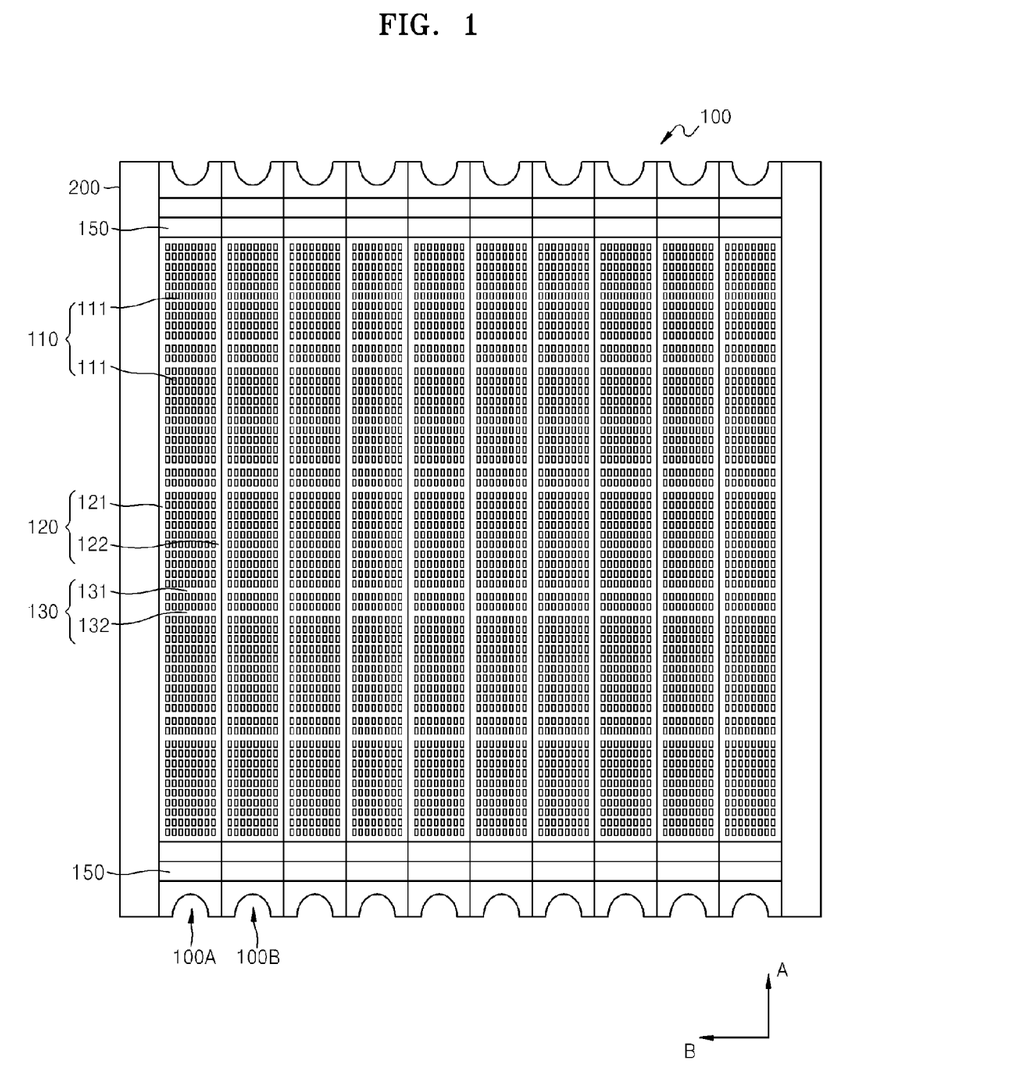
FIG. 1 is a plan view of an embodiment of a mask frame assembly.

FIG. 1 is a plan view of an embodiment of a mask frame assembly.

Referring to FIG. 1, the mask frame assembly includes a frame 200, and a mask 100 having both ends fixed to the frame 200.

The frame 200 which is an outer structure for holding the mask frame assembly has a rectangular shape in a central portion of which an opening (not shown) is formed. Both ends of the mask 100 are welded at welding portions 150 on a pair of sides of the frame 200 facing each other.

The mask 100 may include a plurality of divided masks 100A, 100B, . . . which have stripe shapes and are arranged in a second direction (width direction) B perpendicular to a first direction A in which the mask 100 is stretched.

In order to reduce sagging due to weight, the plurality of divided masks 100A, 100B, . . . are formed in the plurality of stripe shapes as shown in FIG. 1 without being formed as one mask that covers the opening (not shown) of the frame 200. Although the following explanation will be focused on the divided masks 100A, 100B, . . . , embodiments are not limited thereto, and the mask 100 may have any one of various shapes, including a mask 100 that is shorter in a width direction than in a length direction in which the mask 100 is stretched.

Each of the divided masks 100A, 100B, . . . includes a deposition area 110 including a plurality of deposition pattern portions 111, an edge unit 120 including a first edge 121 and a second edge 122 disposed on both sides of the deposition area 110, and a rib unit 130, including a first rib 131 and second rib 132, formed between adjacent ones of the deposition pattern portions 111.

The deposition pattern portions 111 may be formed by electroforming to achieve fine patterning and excellent surface smoothness. In other embodiments, the deposition pattern portions 111 may be formed by etching. In some embodiments, the deposition pattern portions 111 may be formed by forming a resist layer having the same pattern as a pattern of each of the deposition pattern portions 111 on a thin plate by using a photoresist or attaching a film having a pattern on a thin plate, and etching the thin plate.

Although the deposition pattern portions 111 are formed in dot shapes in FIG. 1, in other embodiments, the deposition pattern portions 111 may be any of various shapes such as, for example, slit shapes or a large rectangular shape.

In order to perform patterning with high precision by using the mask 100 including the plurality of deposition pattern portions 111, a shadow phenomenon can be reduced by increasing adhesion between the mask 100 and a substrate 300. Accordingly, it is preferable that the mask 100 is formed of a thin plate. The mask 100 may be formed of nickel (Ni), a nickel alloy, a nickel-cobalt alloy, or the like.

Figure 2:
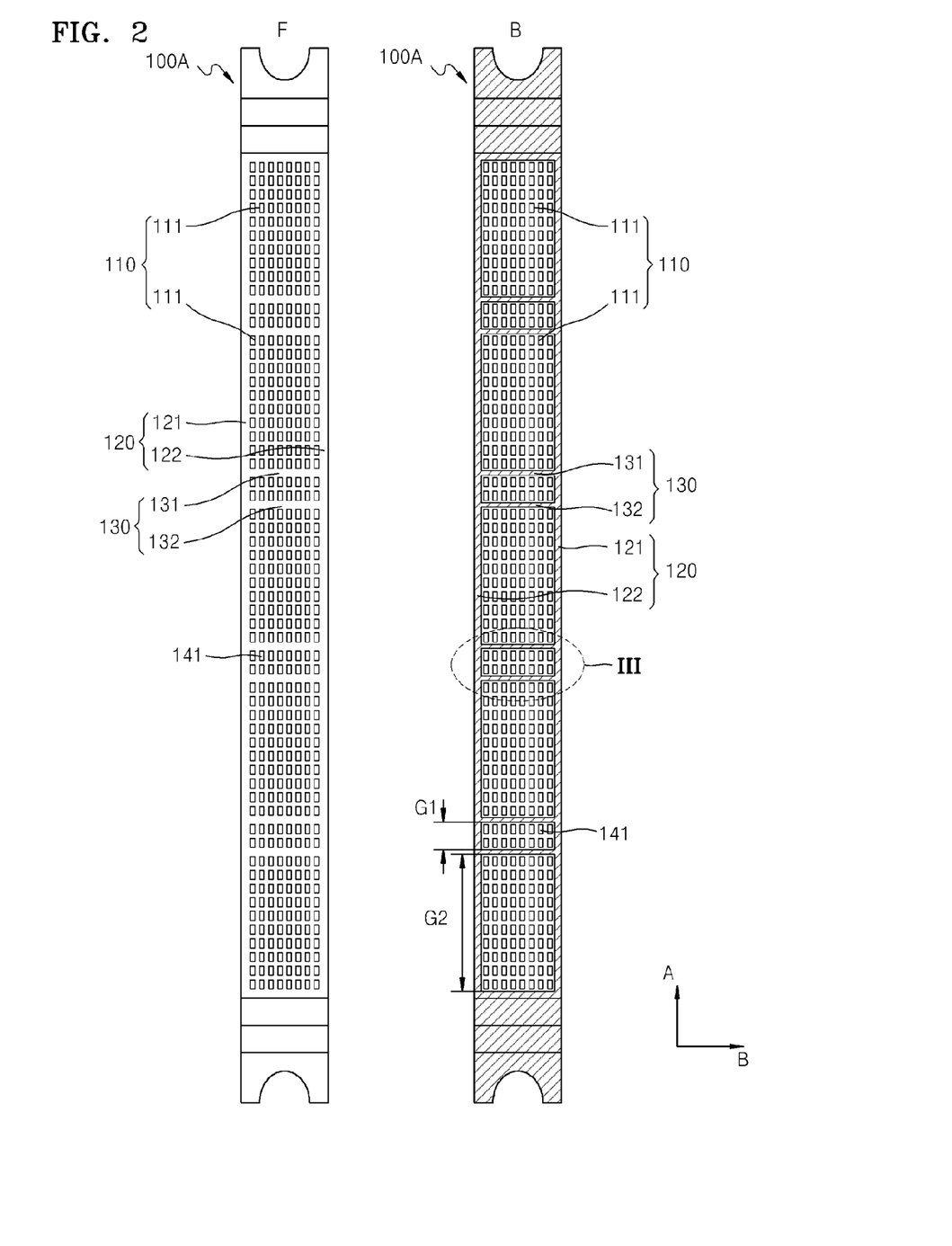
FIG. 2 illustrates plan views of a front surface and a back surface of one of divided masks of the embodiment of a mask frame assembly of FIG. 1.
Figure 3:
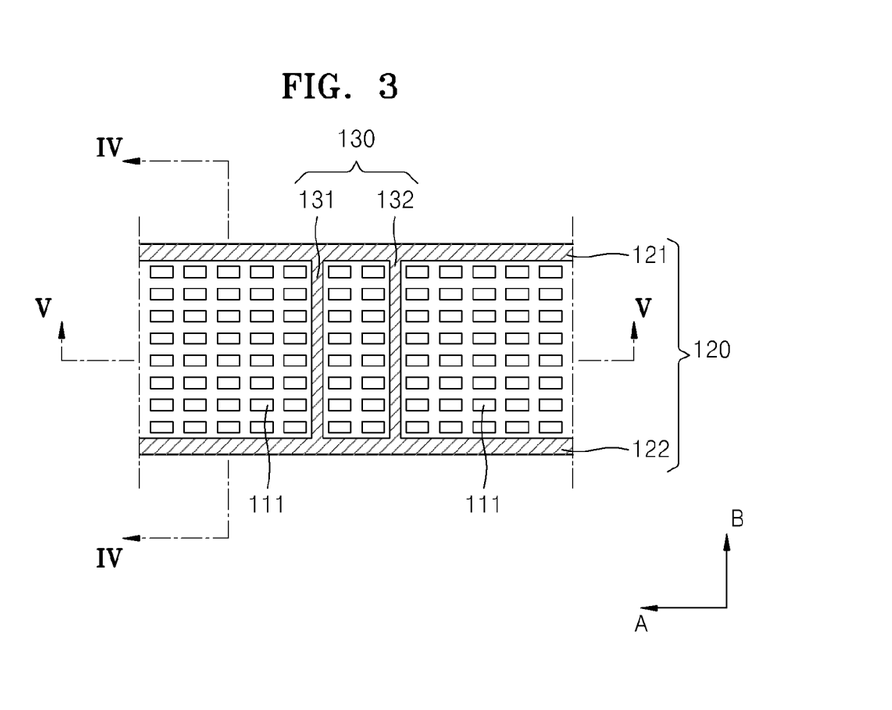
FIG. 3 is an enlarged plan view illustrating portion III of FIG. 2.
Figure 4:
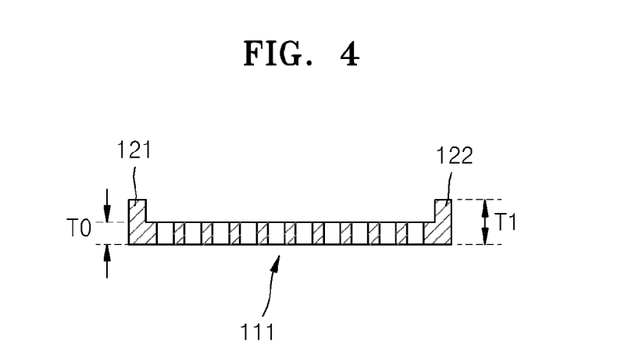
FIG. 4 is a cross-sectional view taken along line IV-IV of FIG. 3.
Figure 5:
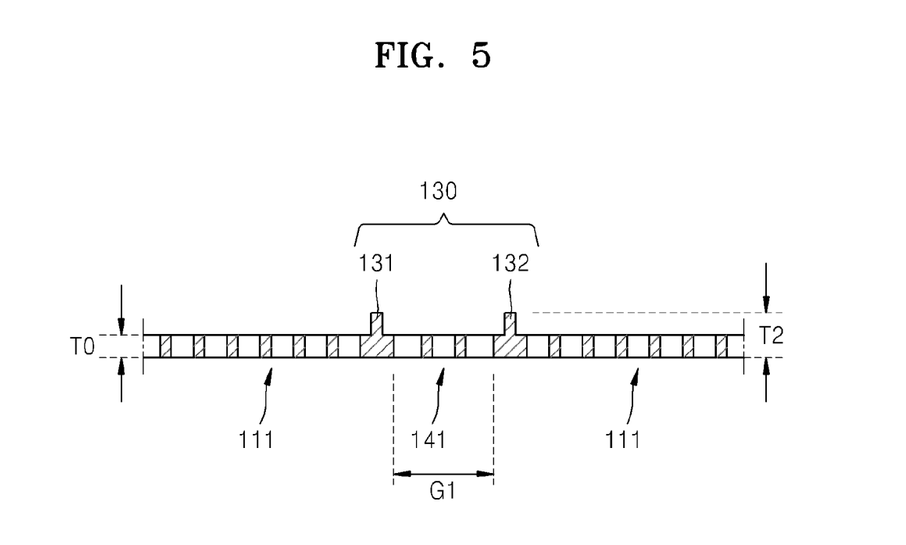
FIG. 5 is a cross-sectional view taken along line V-V of FIG. 3.

FIG. 2 illustrates plan views of a front surface F and a back surface B of one of the divided masks 100A, 100B, . . . of the mask frame assembly of FIG. 1. FIG. 3 is an enlarged plan view illustrating portion III of FIG. 2. FIG. 4 is a cross-sectional view taken along line IV-IV of FIG. 3. FIG. 5 is a cross-sectional view taken along line V-V of FIG. 3.

Referring to FIGS. 2 and 3, the first edge 121 and the second edge 122 of the edge unit 120 face each other in the first direction A, and are disposed on both sides of the deposition area 110 of the divided mask 100A.

Referring to FIG. 4, a thickness T1 of the edge unit 120 is greater than a thickness T0 of the deposition area 110.

Referring to FIGS. 3 and 4, the rib unit 130, including first rib 131 and second rib 132 facing each other in the second direction B perpendicular to the first direction A, is disposed between adjacent ones of the deposition pattern portions 111 of the divided mask 100A.

Referring to FIG. 5, a thickness T2 of the rib unit 130 is greater than the thickness T0 of the deposition area 110. In some embodiments, the thickness T1 of the edge unit 120 may be the same as the thickness T2 of the rib unit 130.

In general, in order to prevent sagging due to thermal expansion or due to the weight when the divided mask 100A is installed on the frame 200, the divided mask 100A is fixed to the frame 200 in a state where a tensile force is applied in the first direction A, the longitudinal direction. In some cases, a contractile force is applied in the second direction B, the width direction, and thus wave-shaped wrinkles may occur in the divided mask 100A. In particular, since masks are relatively thin, having a thickness of about several to tens of micrometers (μm) in order to reduce a shadow phenomenon that may affect the thickness of a deposited film, wrinkles more easily occur in the masks due to a contractile force applied in a width direction.

In embodiments of the mask frame assembly, since the edge unit 120 is formed around the deposition area 110 in the first direction A in which the divided mask 100A is stretched, and the rib unit 130 is formed in the second direction B perpendicular to the first direction A between adjacent ones of the deposition pattern portions 111, wrinkles may be prevented from occurring in the divided mask 100A. Accordingly, since the flatness of the divided mask 100A is improved, pattern precision may be improved when the divided mask A is welded while being stretched.

Although the edge unit 120 and the rib unit 130 are continuously connected in FIGS. 1 through 3, in other embodiments the edge unit 120 and the rib unit 130 may be separated from each other.

In some embodiments, as the one shown in FIG. 5, a dummy deposition pattern portion 141 may be further disposed between adjacent ones of the deposition pattern portions 111. The dummy deposition pattern portion 141 is formed between the first rib 131 and the second rib 132 disposed between adjacent ones of the deposition pattern portions 111. The dummy deposition pattern portion 141 may further prevent wrinkles from occurring in the width direction B by reducing a contractile force applied in the width direction B.

As illustrated in FIG. 2, a width G1 of the dummy deposition pattern portion 141 is less than a width G2 of each of the deposition pattern portions 111, in order to have a sufficient display area.

A pattern of the dummy deposition pattern portion 141 may be the same as a pattern of each of the deposition pattern portions 111, in order to facilitate a mask manufacturing process. In other embodiments, the dummy deposition pattern portion 141 may have any one of other shapes.

If it is desired that a pattern not be deposited on the substrate 300 (see FIG. 6) to correspond to the dummy deposition pattern portion 141, a cover mask 400 (see FIG. 6) may be used to cover the dummy deposition pattern portion 141.

Embodiments of the mask frame assembly may be used for various thin film deposition, and to form a pattern of an organic film or a second electrode of an organic light-emitting display device. The mask frame assembly may be mounted on a deposition device (not shown) to perform deposition.

Figure 6:
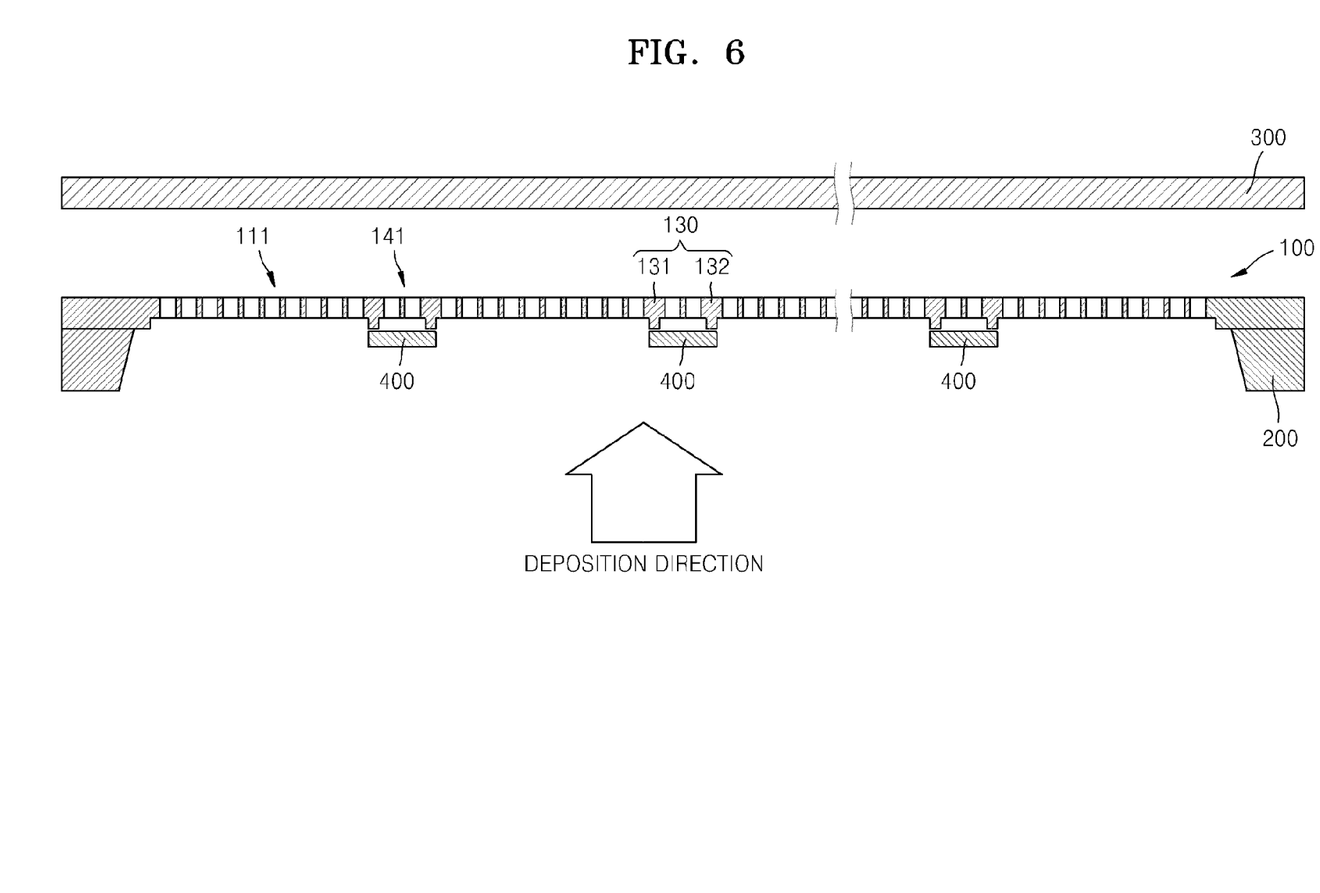
FIG. 6 is a cross-sectional view illustrating a case where deposition is performed on a substrate for forming an organic light-emitting display device by using the mask frame assembly of FIG. 1.

FIG. 6 is a cross-sectional view illustrating a case where deposition is performed on the substrate 300 for forming an organic light-emitting display device by using the mask frame assembly of FIG. 1.

Referring to FIG. 6, in order to deposit an organic light-emitting film or a second electrode of the organic light-emitting display device by using the mask 100, an assembly of the mask 100 and the frame 200 is installed on a side corresponding to a deposition container (not shown) installed in a vacuum chamber (not shown). The mask frame assembly is installed by fixing the mask 100 to the frame 200, where the mask 100 includes the rib unit 140 and the edge unit 120 each thicker than the deposition area 110, while stretching the mask 100. In this way, the mask frame assembly is located adjacent to the substrate 300 for forming the organic light-emitting display device, and an organic light-emitting material or a second electrode forming material (a deposition material, not shown) is deposited in a deposition chamber (not shown). In some embodiments, if the cover mask 400 for covering the dummy deposition pattern portion 141 is added, the deposition material is not deposited on a portion of the substrate 300 corresponding to the dummy deposition pattern portion 141.

Since the mask 100 including the rib unit 140 and the edge portion 120 each thicker than the deposition area 110 is stably fixed to the frame 200, a shadow phenomenon is reduced, thereby enabling to precisely form a pattern of an organic film or a second electrode on the substrate 300.

Figure 7:
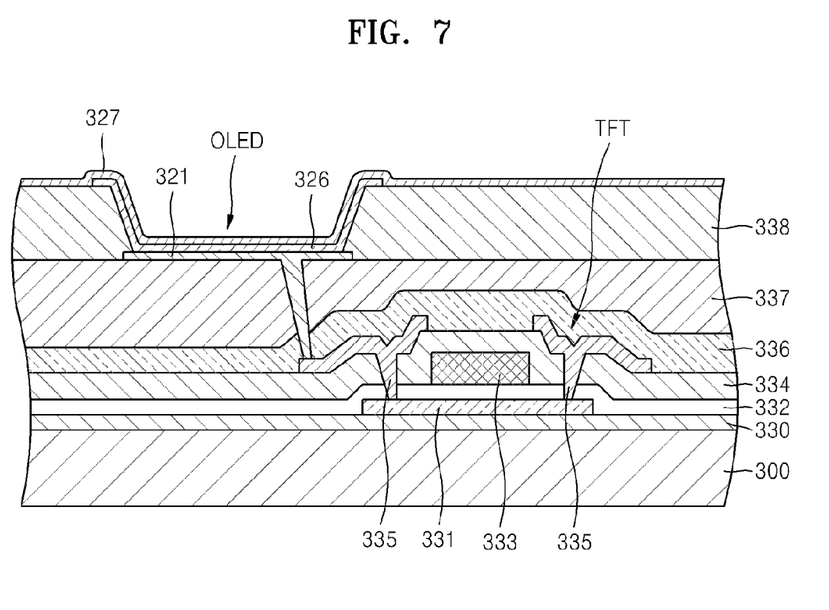
FIG. 7 is a cross-sectional view of an embodiment of an organic light-emitting display device formed by using the mask frame assembly of FIG. 1.

FIG. 7 is a cross-sectional view of an embodiment of the organic light-emitting display device formed by using the mask frame assembly of FIG. 1.

An active matrix (AM) organic light-emitting display device is illustrated in FIG. 7 as the organic light-emitting display device. FIG. 7 illustrates one sub-pixel of the AM organic light-emitting display device.

In FIG. 7, each of sub-pixels includes at least one thin film transistor (TFT) and an electroluminescent (EL) element that is a self-emissive device such as an organic light-emitting device (OLED). Embodiments of the TFT are not limited to that illustrated in FIG. 7, and the number and structure of the TFT may be modified in various ways. Such an AM organic electroluminescent display device is described in detail below.

As shown in FIG. 7, a buffer layer 330 is formed on a substrate 300, and a TFT is disposed on the buffer layer 330.

The TFT includes a semiconductor active layer 331, a gate insulating film 332 formed to cover the active layer 331, and a gate electrode 333 formed on the gate insulating film 332.

An interlayer insulating film 334 is formed to cover the gate electrode 333, and source and drain electrodes 335 are formed on the interlayer insulating film 334.

The source and drain electrodes 335 respectively contact a source region and a drain region of the active layer 331 through contact holes formed in the gate insulating film 332 and the interlayer insulating film 334.

A first electrode layer 321 which is an anode of the OLED is connected to the source and drain electrodes 335. The first electrode layer 321 is formed on a passivation layer 336 and a planarization film 337, and a pixel defining film 338 is formed to cover the first electrode layer 321. After a predetermined opening is formed in the pixel defining film 338, an organic layer 326 of the OLED is formed, and a second electrode layer 327 is deposited as a common electrode on a resultant structure.

The organic layer 326 of the OLED includes red (R), green (G), and blue (B) organic light emitting layers to create full color images. A high precision pattern may be obtained by increasing adhesion between the substrate 300 and the mask 100, as described above, by using the mask frame assembly including the deposition pattern portions 111 which are formed in dot shapes.

In some embodiments, the deposition pattern portions 111 of the mask 100 are entirely opened in the second electrode layer 327, which aids in increasing adhesion between the substrate 300 and the mask 100 as described above.

The organic light-emitting display device is sealed to prevent the penetration of external oxygen and moisture. Although an OLED is illustrated in FIG. 7, in other embodiments, the structure of the OLED may be modified in various ways.

As described above, according to embodiments of the mask frame assembly and the method of manufacturing the organic light-emitting display device using the mask frame assembly, although a mask is welded to a frame while being stretched, the mask may be rarely deformed due to wrinkles. Accordingly, if it is used during deposition, an organic light-emitting display device with high resolution may be manufactured.

While the present invention has been particularly shown and described with reference to certain embodiments thereof, it will be understood by one of ordinary skill in the art that various changes in form and details may be made therein without departing from the spirit and scope of the present invention as defined by the following claims.

What is claimed is:

1. A mask frame assembly comprising:
   a frame; and
   a mask installed on the frame while being stretched in a first direction, wherein the mask comprises:
   a deposition area comprising a plurality of deposition pattern portions;
   an edge unit formed to have a thickness greater than a thickness of the deposition area, and comprising a first edge and a second edge that extend in the first direction on two sides of the deposition area; and
   two or more ribs formed between adjacent deposition pattern portions in a second direction perpendicular to the first direction, wherein the two or more ribs are configured to have a thickness greater than the thickness of the deposition area, wherein a dummy deposition pattern portions is disposed between the two or more ribs.

2. The mask frame assembly of claim 1, wherein a pattern of the dummy deposition pattern portion is the same as a pattern of each of the deposition pattern portions.

3. The mask frame assembly of claim 1, further comprising a cover mask for covering an area corresponding to the dummy deposition pattern portion.

4. The mask frame assembly of claim 1, wherein a width of the dummy deposition pattern portion is less than a width of each of the deposition pattern portions.

5. The mask frame assembly of claim 1, wherein the thickness of the edge unit is the same as a thickness of each of the ribs.

6. The mask frame assembly of claim 1, wherein the edge unit and the ribs are connected to each other.

7. The mask frame assembly of claim 1, wherein the mask comprises a plurality of divided masks installed on the frame, wherein the first direction is a longitudinal direction of each of the plurality of divided masks and the second direction is a width direction of each of the plurality of divided masks.

8. A method of manufacturing an organic light-emitting display device comprising a substrate, a first electrode and a second electrode disposed on the substrate to face each other, and an organic film disposed between the first electrode and the second electrode,
   wherein the organic film or the second electrode is deposited by using a mask frame assembly comprising a frame and a mask installed on the frame while being stretched in a first direction,
   wherein the mask comprises:
   a deposition area comprising a plurality of deposition pattern portions;
   an edge unit formed to have a thickness greater than a thickness of the deposition area and comprising a first edge and a second edge that extend in the first direction on two sides of the deposition area; and
   two or more ribs formed between adjacent deposition pattern portions in a second direction perpendicular to the first direction, wherein the two or more ribs are configured to have a thickness greater than the thickness of the deposition area, wherein a dummy deposition pattern portions is disposed between the two or more ribs.

* * * * *